US010307792B2

(12) United States Patent
Bai et al.

(10) Patent No.: US 10,307,792 B2
(45) Date of Patent: Jun. 4, 2019

(54) ULTRASONIC TRANSDUCER, ULTRASONIC FINGER RECOGNITION SENSOR AND ELECTRONIC DEVICE

(71) Applicant: NANCHANG O-FILM BIO-IDENTIFICATION TECHNOLOGY CO., LTD., Nanchang (CN)

(72) Inventors: Anpeng Bai, Nanchang (CN); Wensi Sun, Nanchang (CN)

(73) Assignee: NANCHANG O-FILM BIO-IDENTIFICATION TECHNOLOGY CO., LTD, Nanchang (CN)

( * ) Notice: Subject to any disclaimer, the term of this patent is extended or adjusted under 35 U.S.C. 154(b) by 14 days.

(21) Appl. No.: 15/491,041

(22) Filed: Apr. 19, 2017

(65) Prior Publication Data

US 2018/0065150 A1 Mar. 8, 2018

(30) Foreign Application Priority Data

Sep. 5, 2016 (CN) .......................... 2016 1 0802632
Sep. 5, 2016 (CN) ..................... 2016 2 1037768 U

(51) Int. Cl.

*G06K 9/00* (2006.01)
*B06B 1/06* (2006.01)
*H01L 41/08* (2006.01)

(52) U.S. Cl.

CPC .......... *B06B 1/0629* (2013.01); *G06K 9/0002* (2013.01); *H01L 41/0825* (2013.01)

(58) Field of Classification Search

CPC .. B06B 1/0629; G06K 9/0002; H01L 41/0825
USPC ......... 73/626, 570, 584, 596, 618, 620, 625; 382/275, 124, 125, 100; 310/311, 328, 310/334, 336, 367, 326; 600/300, 407, 600/437, 459; 29/25.35
See application file for complete search history.

(56) References Cited

U.S. PATENT DOCUMENTS

2010/0060389 A1* 3/2010 Schneider .............. G10K 11/24 333/239
2013/0043768 A1* 2/2013 Cochran ............... B06B 1/0629 310/334
2014/0355381 A1* 12/2014 Lal ........................ B81B 3/0021 367/87

* cited by examiner

*Primary Examiner* — Sheela C Chawan
(74) *Attorney, Agent, or Firm* — Hodgson Russ LLP

(57) ABSTRACT

The present disclosure discloses an ultrasonic transducer. The ultrasonic transducer includes an active layer. The active layer includes an array of piezoelectric pillars configured for emitting and receiving ultrasound and an attenuation portion surrounding sidewalls of the piezoelectric pillars and configured for attenuating a part of the ultrasound emitted from the sidewalls of the piezoelectric pillars. The present disclosure also relates to an ultrasonic fingerprint recognition sensor and an electronic device having the ultrasonic transducer.

20 Claims, 6 Drawing Sheets

10
1224
126
12
1222
122
128
1226
124

ULTRASONIC TRANSDUCER, ULTRASONIC FINGER RECOGNITION SENSOR AND ELECTRONIC DEVICE

CROSS-REFERENCE TO RELATED APPLICATION

This application claims priority to and benefits of Chinese Patent Application Serial Nos. 201610802632.9 and 201621037768.7, filed with the State Intellectual Property Office of P. R. China on Sep. 5, 2016, the entire contents of which are incorporated herein by reference.

FIELD

The present disclosure relates to ultrasonic fingerprint recognition technologies and, particularly, to an ultrasonic transducer, an ultrasonic fingerprint recognition device and an electronic device.

BACKGROUND

An ultrasonic finger recognition sensor recognizes a fingerprint by emitting ultrasound to a finger and detecting the ultrasound reflected by the finger using an ultrasonic transducer. The ultrasonic transducer typically emits and detects the ultrasound in all directions. As a result, the ultrasonic transducer may detect the ultrasound that is not reflected by the finger and thus noise may be introduced.

SUMMARY

The present disclosure aims to solve at least one of the problems existing in the prior art to some extent at least.

An ultrasonic transducer of an embodiment of the present disclosure includes an active layer. The active layer includes an array of piezoelectric pillars configured for emitting and receiving ultrasound and an attenuation portion surrounding sidewalls of the piezoelectric pillars and configured for attenuating a part of the ultrasound emitted from the sidewalls of the piezoelectric pillars.

In some embodiments, the piezoelectric pillars are made of piezoelectric material selected from the group consisting of: monocrystalline ceramics, polycrystalline ceramics, polymers, and compound thereof.

In some embodiments, the piezoelectric pillars are made of lead zirconate titanate piezoelectric ceramics.

In some embodiments, the piezoelectric pillar is a rectangular pillar.

In some embodiments, the piezoelectric pillars runs through the active layer substantially along a height direction of the active layer.

In some embodiments, the attenuation portion is made of a material with an acoustic impedance substantially lower than about 4.53 M Rayls.

In some embodiments, the attenuation portion is made of silica gel.

In some embodiments, the attenuation portion is integrally formed by filling a material of the attenuation portion among the piezoelectric pillars.

In some embodiments, the attenuation portion is integrally formed by cutting a layer of the material of the attenuation portion to from an array of holes for receiving the piezoelectric pillars respectively.

In some embodiments, the attenuation portion is in contact with the piezoelectric pillars.

In some embodiments, the attenuation portion is spaced away from the piezoelectric pillars.

In some embodiments, gaps formed between the attenuation portion and the piezoelectric pillars are of constant uniform width.

In some embodiments, the attenuation portion comprises a first portion surrounding the piezoelectric pillars and a second portion surrounding the first portion.

In some embodiments, the second portions are of constant uniform width.

In some embodiments, at least one of the first portion and the second portion is made of a material with an acoustic impedance substantially lower than about 4.53 M Rayls.

In some embodiments, the piezoelectric pillars run through the active layer along a height direction of the active layer, the ultrasonic transducer further comprises a plurality of receiving electrode lines formed on the active layer and each of the receiving electrode lines is connected to a column of the piezoelectric pillar, and a plurality emitting electrode lines formed on the active layer and each of the emitting electrode lines is connected to a column of the piezoelectric pillars.

In some embodiments, the ultrasonic transducer further comprises a top protective layer formed on the upper surface and covers the active layer and the receiving electrode lines, and a bottom protective layer formed on the lower surface and covers the active layer and the emitting electrode lines.

In some embodiments, an acoustic resistance of the top protective layer is substantially greater than an acoustic resistance of the attenuation portion.

In some embodiments, an acoustic resistance of the bottom protective layer is substantially greater than an acoustic resistance of the top protective layer.

An ultrasonic fingerprint recognition device of an embodiment of the present disclosure includes a substrate, a control chip positioned on and electrically connected to the substrate, the ultrasonic transducer, positioned on and electrically connected to the control chip, and a package packing the substrate, the control chip, and the ultrasonic transducer as a module.

An electronic device of an embodiment of the present disclosure includes a casing and the ultrasonic fingerprint recognition device positioned in the casing for fingerprint recognition or authorization.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the accompanying drawings, in which.

DETAILED DESCRIPTION

Figure 1:
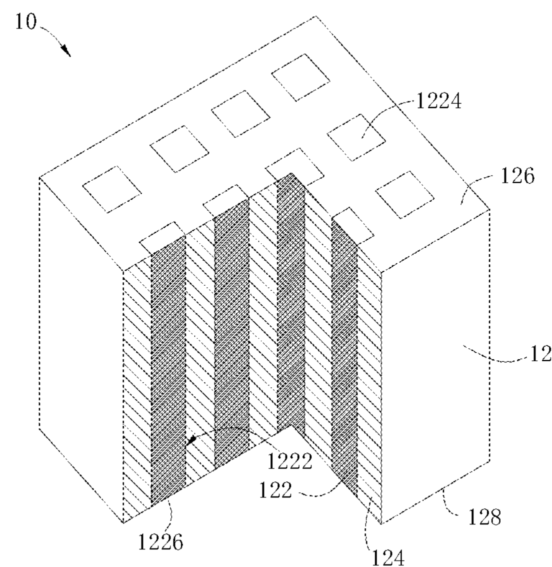
FIG. 1 is an isometric schematic view of an ultrasonic transducer, according an embodiment of the present disclosure.

Embodiments of the present disclosure will be described in detail in the following descriptions, examples of which are shown in the accompanying drawings, in which the same or similar elements and elements having same or similar functions are denoted by like reference numerals throughout the descriptions.

The embodiments described herein with reference to the accompanying drawings are explanatory and illustrative, which are used to generally understand the present disclosure. The embodiments shall not be construed to limit the present disclosure.

Figure 2:
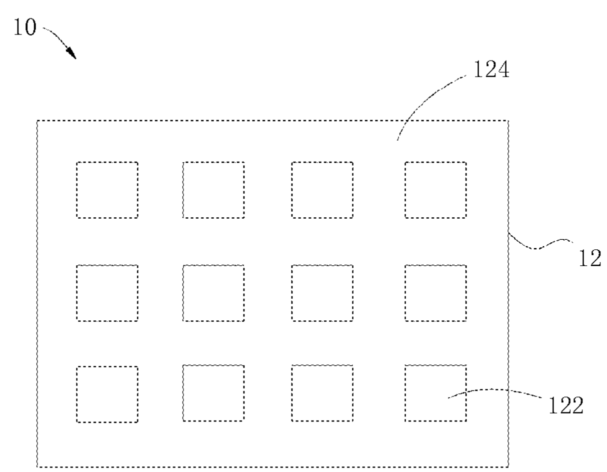
FIG. 2 is a top schematic view of the ultrasonic transducer, according an embodiment of the present disclosure.

Referring to FIG. 1 and FIG. 2, an ultrasonic transducer 10, according to an embodiment of the present disclosure, includes an active layer 12. The active layer 12 includes an array of piezoelectric pillars 122 and an attenuation portion 124. The piezoelectric pillars 122 are configured for emitting and receiving ultrasound. The attenuation portion 124 surrounds sidewalls 1222 of the piezoelectric pillars 122 and is configured for attenuating part of the ultrasound emitted from the sidewalls of the piezoelectric pillars 124.

The piezoelectric pillars 122 can be made of piezoelectric material, such as monocrystalline ceramics, polycrystalline ceramics, polymers, and any suitable compound thereof. In this embodiment, the piezoelectric pillars 122 are made of lead zirconate titanate piezoelectric ceramics.

Figure 3:
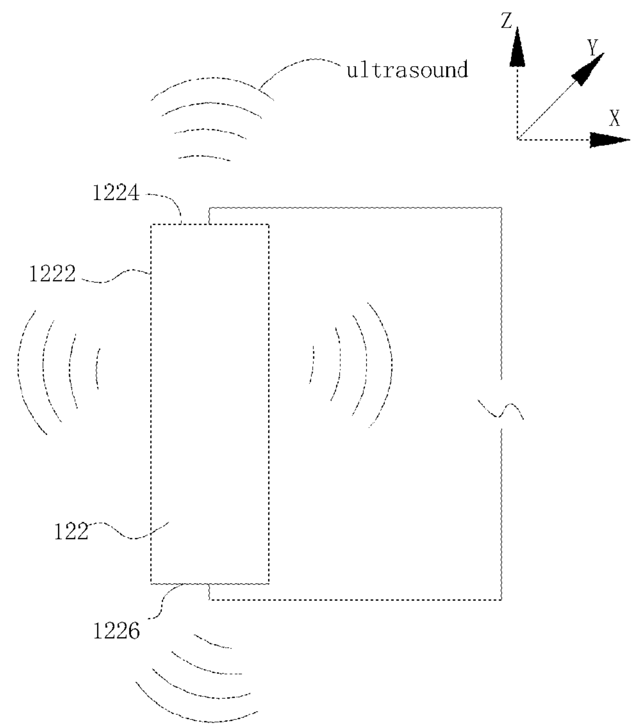
FIG. 3 is a schematic view showing what a reverse piezoelectric effect of a piezoelectric pillar of the ultrasonic transducer is, according an embodiment of the present disclosure.
Figure 4:
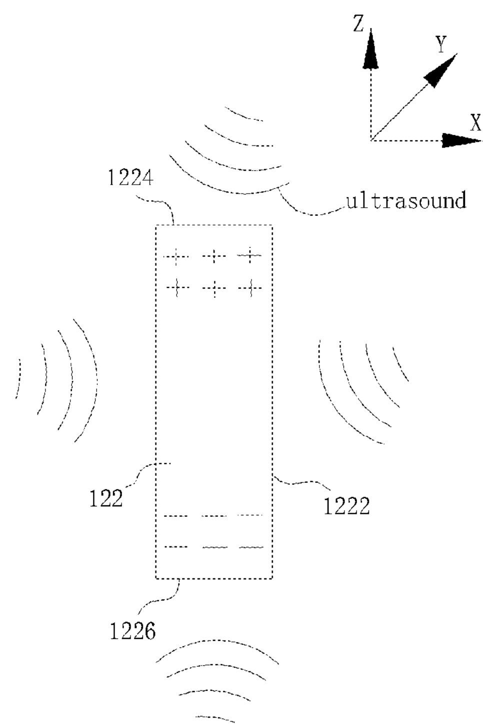
FIG. 4 is a schematic view showing what a direct piezoelectric effect of the piezoelectric pillar is, according an embodiment of the present disclosure.

As such, also referring to FIG. 3 and FIG. 4, the piezoelectric pillars 122 can generate the ultrasound (i.e., sound waves with frequencies higher than the upper audible limit of human hearing) utilizing a reverse piezoelectric effect (i.e., an internal generation of a mechanical strain resulting from an applied electrical field) and also can detect the ultrasound utilizing a direct piezoelectric effect (i.e., an internal generation of electrical charge resulting from an applied mechanical force).

In operation, the piezoelectric pillars 122 are driven to generate and transmit the ultrasound. The ultrasound can to penetrate the epidermal layer of a finger in a transmitting way thereof and is reflected by the dermal skin layer of the finger (not shown). Since the dermal skin layer of the finger exhibits the same characteristic pattern of a fingerprint of the finger, the ultrasound reflected back from the finger can be detected by the piezoelectric pillars 122 and can be used to form an image of the fingerprint.

For forming the image of the fingerprint, each of the piezoelectric pillars 122 functions as a pixel of the piezoelectric sensor 10 to form a pixel of the image of the fingerprint. As such, it is required that the piezoelectric pillars 122 transmits and detects the ultrasound along a longitudinal direction thereof (i.e., along a Z-axis as shown in FIG. 5).

Figure 5:
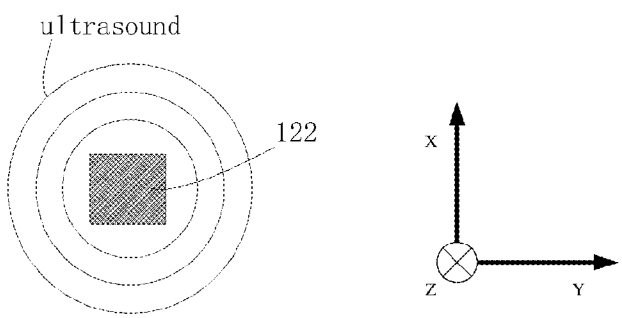
FIG. 5 is a schematic view showing how the piezoelectric pillar works without an attenuation portion of the ultrasonic transducer, according an embodiment of the present disclosure.

However, also referring to FIG. 5, the piezoelectric pillar 122 typically transmits and receives the ultrasound in all directions, including a transverse direction (i.e., along an XY-plane as shown in FIG. 5). As such, the ultrasonic emitted from the sidewall 1222 of the piezoelectric pillar 122 may be directly detected by the adjacent piezoelectric pillar 122 without reflection of the finger, and thus crosstalk noise is introduced.

Figure 6:
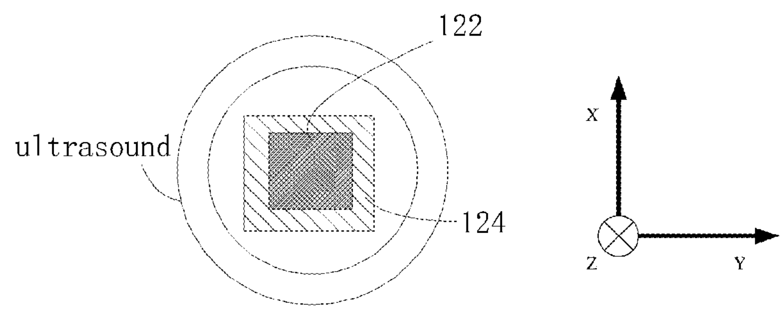
FIG. 6 is a schematic view showing how the piezoelectric pillar works with the attenuation portion of the ultrasonic transducer, according an embodiment of the present disclosure.

However, also referring to FIG. 6, in the embodiments of the present disclosure, the ultrasound emitted from the sidewalls 1222 of the piezoelectric pillars 122 can be attenuated by the attenuation portion 124 and thus the crosstalk noise is controlled.

In some embodiments, the piezoelectric pillar 122 is a rectangular pillar to facilitate manufacturing. However, in other embodiments, the piezoelectric pillar 122 can be a pillar, i.e., a column or a post, with a cross section of any suitable geometry such as circular.

In addition to the sidewall 1222, i.e., a lateral side surface or a transverse side surface, the piezoelectric pillar 122 also includes a top surface 1224 and a bottom surface 1226, i.e., two longitudinal end surfaces.

In some embodiments, the active layer 12 is typically in a form of a thin film, of which a length and a width are both greatly larger than a height, and includes an upper surface 126 and a lower surface 128. As such, to provide sufficient area for receiving the finger, the upper surface 126 (or the lower surface 128 in other embodiments) can function as an active surface on which the finger can put and thus configured for receiving the ultrasound reflected back from the finger. Accordingly, the piezoelectric pillars 122 can be arranged substantially along a height direction of the active layer 12, that is, a length direction of the piezoelectric pillars 122 is substantially parallel to the height direction of the active layer 12 and the top surface 1224 can function as a pixel area of the active surface.

In some embodiments, the attenuation portion 124 can be made of material with an acoustic impedance substantially lower than about 4.53 M Rayls, such as silica gel.

As such, the ultrasound can be efficiently attenuated by the attenuation portion 124. It is demonstrated in experiments that if the acoustic impedance of the attenuation portion 124 is higher than about 4.53 M Rayls, attenuation effect of the attenuation portion 124 is unsatisfactory.

In some embodiments, the piezoelectric pillars 122 can be firstly formed and then the attenuation portion 124 can be integrally formed by filling the material such as silica gel among the piezoelectric pillars 122, i.e., filing the matter into gaps of the piezoelectric pillars 122.

In other embodiments, the attenuation portion 124 can be integrally formed by cutting a layer of the material to form holes for receiving the piezoelectric pillars 122 respectively at first and then the piezoelectric pillars 122 are formed by filling the material such as lead zirconate titanate piezoelectric ceramics into the holes.

In the above-mentioned embodiments, the attenuation portion 124 is in contact with the sidewalls 1222 of the piezoelectric pillars 122 and one interface is formed between the attenuation portion 124 and each of the piezoelectric pillars 122 for reflecting and thus attenuating the ultrasound.

Figure 7:
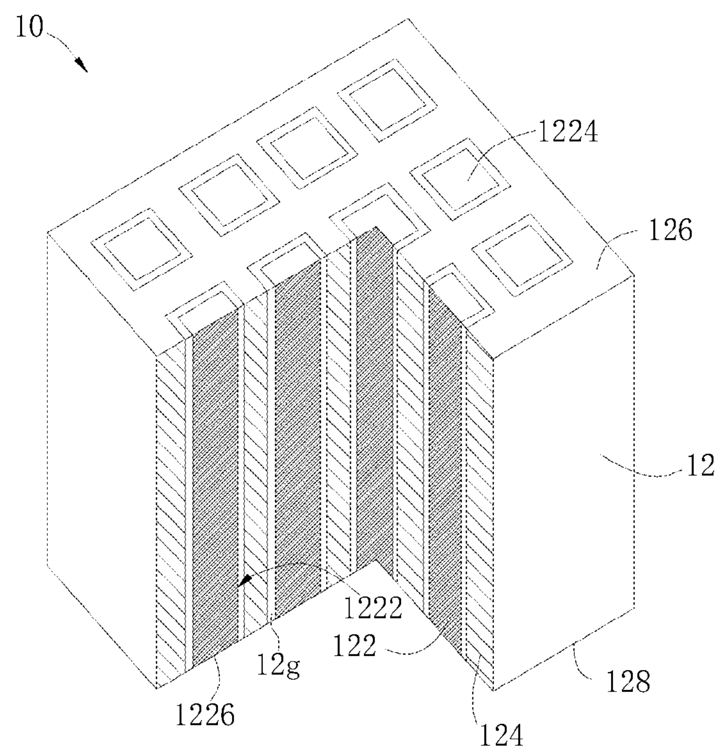
FIG. 7 is an isometric schematic view of an ultrasonic transducer, according another embodiment of the present disclosure.

However, referring to FIG. 7, in other embodiments, the attenuation portion 124 is spaced from the sidewall 1222 of the piezoelectric pillars 122 and thus two interfaces, i.e., one formed between the piezoelectric pillar 122 and the air and another formed between the air and the attenuation portion 124, are formed between the attenuation portion 124 and each of the piezoelectric pillars 122 for reflecting and thus attenuating the ultrasound twice. As such, attenuation effect is improved.

In the embodiments as shown in FIG. 7, gaps 12*g* formed between the attenuation portion 124 and the piezoelectric pillars 122 are of constant uniform width. As such, the attenuation effect caused by the attenuation portion 124 to each of the piezoelectric pillars 122 in all directions are substantially the same.

Also in the embodiments as shown in FIG. 7, the piezoelectric pillars 122 can be fixed in place by means other than the attenuation portion 124.

Figure 8:
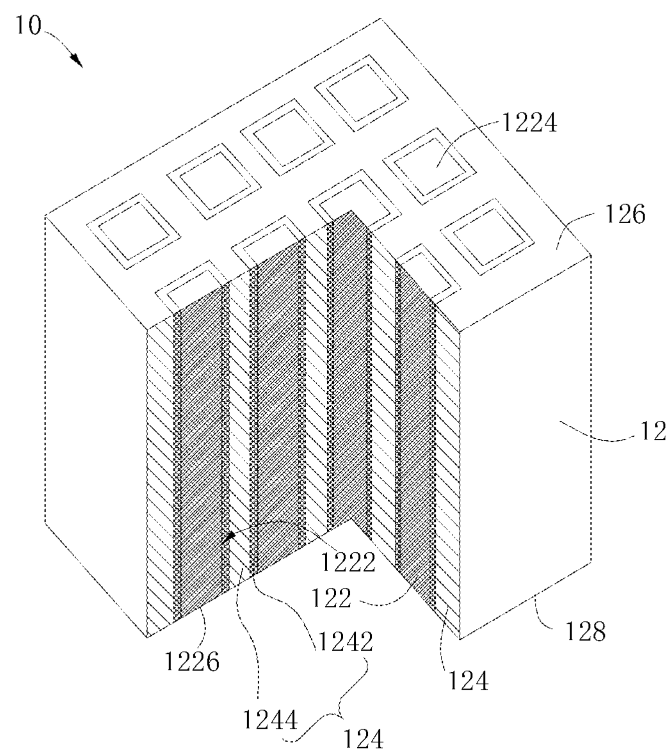
FIG. 8 is an isometric schematic view of an ultrasonic transducer, according further another embodiment of the present disclosure.

Referring to FIG. 8, in further another embodiments, the attenuation portion 124 can include a first portion 1242 surrounding the piezoelectric pillars 122 and a second portion 1244 surrounding the first portion 1242, and thus two interfaces, i.e., one formed between the piezoelectric pillar 122 and the first portion 1242 air and another formed between the first portion 1242 and the second portion 1242, are formed between the attenuation portion 124 and each of the piezoelectric pillars 122 for reflecting and thus attenuating the ultrasound twice. As such, attenuation effect is improved.

In some embodiments, at least one of the first portion 1242 and the second portion 1244 is made of a material with an acoustic impedance substantially lower than about 4.53 M Rayls.

In the embodiments as shown in FIG. 7, the second portions are of constant uniform width. As such, the attenuation effect caused by the attenuation portion 124 to each of the piezoelectric pillars 122 in all directions are substantially the same.

Figure 9:
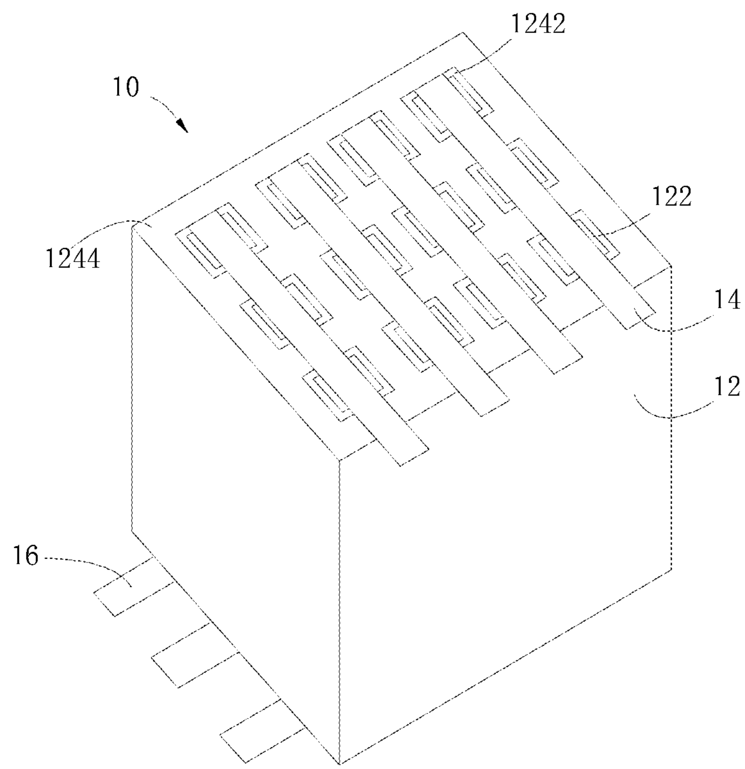
FIG. 9 is another isometric schematic view of an ultrasonic transducer, according an embodiment of the present disclosure.

Also referring to FIG. 9, in some embodiments, the piezoelectric pillars 122 typically run through the active layer 12 along the height direction of the active layer 12. The ultrasonic transducer 10 further includes a number of receiving electrode lines 14 formed on the active layer 12 and each of the receiving electrode lines 14 is connected to a column of the piezoelectric pillars 122, and a number emitting electrode lines 16 formed on the active layer 12 and each of the emitting electrode lines 16 is connected to a column of the piezoelectric pillars 122.

As such, the high frequency driving voltage can be applied to the piezoelectric pillars 122 through the emitting electrode lines 14 and the receiving electrode lines 16.

Figure 10:
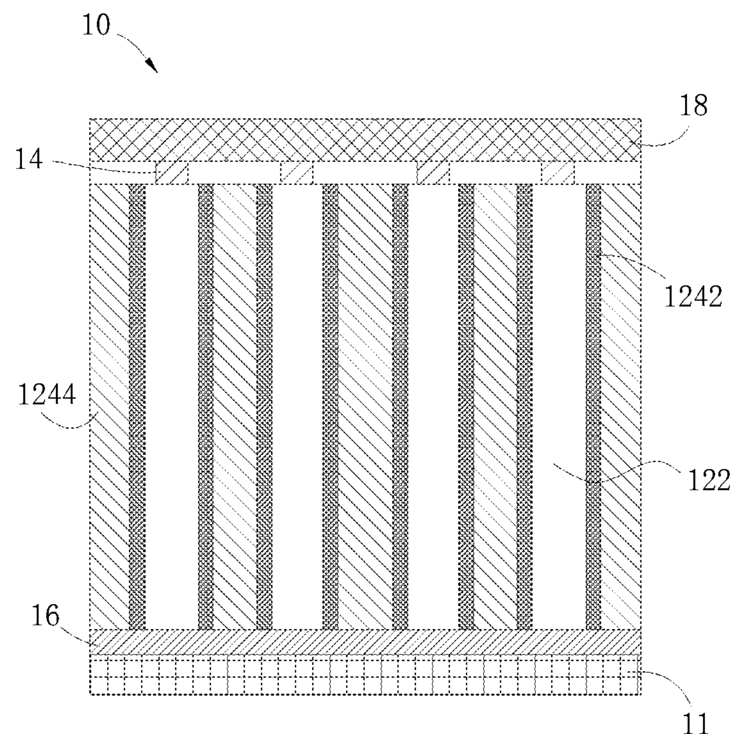
FIG. 10 is a cross-sectional schematic view of an ultrasonic transducer, according an embodiment of the present disclosure.

Also referring to FIG. 10, in some embodiments, the ultrasonic transducer 10 further includes a top protective layer 18 formed on the upper surface 126 and covers the active layer 12 and the receiving electrode lines 14, and a bottom protective layer 11 formed on the lower surface 128 and covers the active layer 12 and the emitting electrode lines 16, thus, the ultrasonic transducer 10 is packaged.

In some embodiments, an acoustic resistance of the top protective layer 18 is substantially greater than the acoustic resistance of the attenuation portion 124.

As such, the ultrasound can efficiently pass the upper surface 126, i.e., the active surface, without or with less attenuation, thus increasing a signal to noise ratio of the ultrasonic transducer 10.

In some embodiments, an acoustic resistance of the bottom protective layer 11 is substantially greater than the acoustic resistance of the top protective layer 18.

As such, the ultrasound can efficiently attenuated by the bottom protective layer 11, thus also increasing a signal to noise ratio of the ultrasonic transducer 10.

Figure 11:
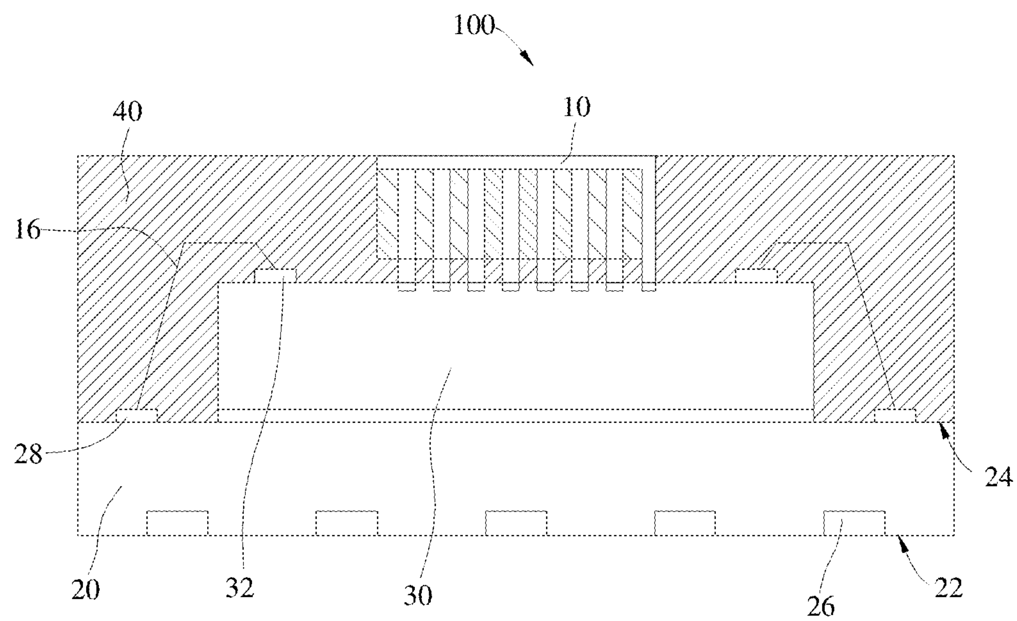
FIG. 11 is a cross-sectional schematic view of an ultrasonic fingerprint recognition sensor, according an embodiment of the present disclosure.

Referring to FIG. 11, an ultrasonic fingerprint recognition sensor 100, according to an embodiment of the present disclosure, includes the ultrasonic transducer 10.

In some embodiments, in addition to the ultrasonic transducer 10, the ultrasonic fingerprint recognition sensor 100 further includes a substrate 20, a control chip 30, and a package 40.

The substrate 20 includes a first surface 22, a second surface 24 opposite to the first surface 22, a number of first electrodes 26 formed in the first surface 22, and a number of second electrodes 28 formed on a periphery of the second surface 24 and electrically connected with the first electrodes 26 in a desired manner.

The control chip 30 is positioned on the substrate 20, e.g., the second surface 24, via, e.g., an adhesive. The control chip 30 includes a number of third electrodes 32 formed on a surface opposite to the substrate 20. The third electrodes 32 can be connected to the second electrodes in a desired manner via, e.g., a wire bonding technology.

The ultrasonic transducer 10 is positioned on and electrically connected to the control chip 30. The package 40 packages and thus fixes the ultrasonic transducer 10, the control chip 30, and the substrate 20 together.

As such, the ultrasonic transducer 10, the control chip 30, and the substrate 20 can work as a module with a substantially complete function. For example, the substrate 20 facilitates connection with external circuits and receives and sends signal to the control chip 30. The control chip 30 controls the ultrasonic transducer 10 to emit and detect the ultrasound and then process the signal from the ultrasonic transducer 10 to recognize the fingerprint or to facilitate recognizing the fingerprint.

Figure 12:
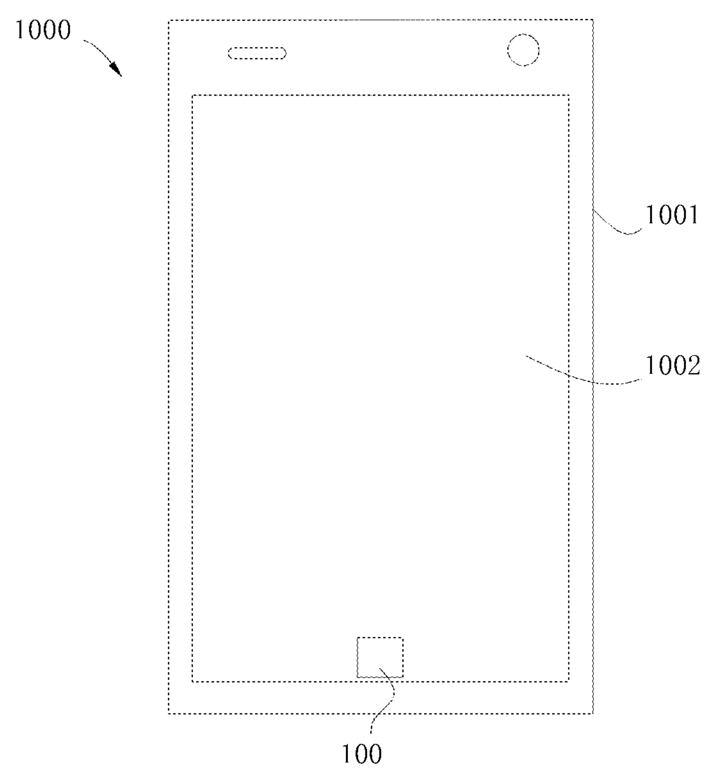
FIG. 12 is a planar schematic view of an electronic device, according an embodiment of the present disclosure.

Referring to FIG. 12, an electronic device 1000, such as a smartphone, a laptop, a tablet, or a TV, according to an embodiment of the present disclosure, includes the ultrasonic fingerprint recognition sensor 100.

In this embodiment, the electronic device 1000 is a smartphone. In addition to the ultrasonic fingerprint recognition sensor 100, the electronic device 1000 further includes a casing 1001 and a display 1002 fixed to a front surface of the casing. The ultrasonic fingerprint recognition sensor 100 can be positioned in the casing 1001, e.g., beneath the display 1002, for fingerprint recognition or authorization.

In this present disclosure, unless indicated otherwise, a structure in which a first feature is "on" or "underneath" a second feature may include an embodiment in which the first feature directly contacts the second feature and may include an embodiment in which an additional feature is prepared between the first feature and the second feature so that the first feature does not directly contact the second feature. Furthermore, a structure in which a first feature is "on" or "above" a second feature may include an embodiment in which the first feature is right above or inclined above the second feature and may include an embodiment in which the first feature is higher than the second feature. A structure in which a first feature is "under" or "below" a second feature may include an embodiment in which the first feature is right under or inclined under the second feature and may include an embodiment in which the first feature is lower than the second feature.

Reference throughout this specification to "an embodiment," "some embodiments," "an illustrated embodiment", "an example," "a specific example," or "some examples," means that a particular feature, structure, material, or characteristic described in connection with the embodiment or example is included in at least one embodiment or example of the present disclosure. The schematic expressions of the above-mentioned phrases throughout this specification are not necessarily referring to the same embodiment or example of the present disclosure. Furthermore, the particular features, structures, materials, or characteristics can be combined in any suitable manner in any one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from scope of the present disclosure.

What is claimed is:

1. An ultrasonic transducer comprising:

an active layer comprising:

an array of piezoelectric pillars configured for emitting and receiving ultrasound; and an attenuation portion surrounding sidewalls of the piezoelectric pillars and configured for attenuating a part of the ultrasound emitted from the sidewalls of the piezoelectric pillars;

wherein the attenuation portion is made of a material with an acoustic impedance substantially lower than about 4.53 M Rayls.

2. The ultrasonic transducer of claim 1, wherein the piezoelectric pillars are made of piezoelectric material selected from the group consisting of: monocrystalline ceramics, polycrystalline ceramics, polymers, and compound thereof.

3. The ultrasonic transducer of claim 1, wherein the piezoelectric pillars are made of lead zirconate titanate piezoelectric ceramics.

4. The ultrasonic transducer of claim 1, wherein each of the piezoelectric pillars is a rectangular pillar.

5. The ultrasonic transducer of claim 1, wherein the piezoelectric pillars runs through the active layer substantially along a height direction of the active layer.

6. The ultrasonic transducer of claim 1, wherein the attenuation portion is made of silica gel.

7. The ultrasonic transducer of claim 1, wherein the attenuation portion is integrally formed by filling a material of the attenuation portion among the piezoelectric pillars.

8. The ultrasonic transducer of claim 1, wherein the attenuation portion is integrally formed by cutting a layer of the material of the attenuation portion to form an array of holes for receiving the piezoelectric pillars respectively.

9. The ultrasonic transducer of claim 1, wherein the attenuation portion is in contact with the piezoelectric pillars.

10. The ultrasonic transducer of claim 1, wherein the attenuation portion is spaced away from the piezoelectric pillars.

11. The ultrasonic transducer of claim 10, wherein gaps formed between the attenuation portion and the piezoelectric pillars are of constant uniform width.

12. The ultrasonic transducer of claim 1, wherein the attenuation portion comprises a first portion surrounding the piezoelectric pillars and a second portion surrounding the first portion.

13. The ultrasonic transducer of claim 12, wherein the second portions are of constant uniform width.

14. The ultrasonic transducer of claim 12, wherein at least one of the first portion and the second portion is made of a material with an acoustic impedance substantially lower than about 4.53 M Rayls.

15. The ultrasonic transducer of claim 1, wherein the piezoelectric pillars run through the active layer along a height direction of the active layer, the ultrasonic transducer further comprises a plurality of receiving electrode lines formed on the active layer and each of the receiving electrode lines is connected to a column of the piezoelectric pillar, and a plurality of emitting electrode lines formed on the active layer and each of the emitting electrode lines is connected to a column of the piezoelectric pillars.

16. The ultrasonic transducer of claim 15, wherein the ultrasonic transducer further comprises a top protective layer formed on the upper surface that covers the active layer 12 and the receiving electrode lines, and a bottom protective layer formed on the lower surface and covers the active layer and the emitting electrode lines.

17. The ultrasonic transducer of claim 16, wherein an acoustic resistance of the top protective layer is substantially greater than an acoustic resistance of the attenuation portion.

18. The ultrasonic transducer of claim 16, wherein an acoustic resistance of the low protective layer is substantially greater than an acoustic resistance of the top protective layer 18*n*.

19. An ultrasonic fingerprint recognition device, comprising:

a substrate;

a control chip positioned on and electrically connected to the substrate;

the ultrasonic transducer of claim 1, positioned on and electrically connected to the control chip; and a package packing the substrate, the control chip, and the ultrasonic transducer as a module.

20. An electronic device comprising:

a casing; and the ultrasonic fingerprint recognition device of claim 19 positioned in the casing for fingerprint recognition or authorization.

* * * * *